US012635547B1

(12) United States Patent
Brown et al.

(10) Patent No.: US 12,635,547 B1
(45) Date of Patent: May 19, 2026

(54) INDIUM BUMP FABRICATION ON NON-PLANAR SURFACE

(71) Applicant: United States of America as represented by the Administrator of NASA, Washington, DC (US)

(72) Inventors: Ari D. Brown, Ellicott City, MD (US); Vilem Mikula, Lanham, MD (US); Johannes Staguhn, Baltimore, MD (US); Archana Devasia, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 445 days.

(21) Appl. No.: 18/382,313

(22) Filed: Oct. 20, 2023

(51) Int. Cl.
    *H10W 70/67*     (2026.01)
    *H10W 72/00*     (2026.01)
    *H10W 72/20*     (2026.01)

(52) U.S. Cl.
    CPC ........ *H10W 70/688* (2026.01); *H10W 72/012* (2026.01); *H10W 72/01204* (2026.01); *H10W 72/01238* (2026.01); *H10W 72/252* (2026.01)

(58) Field of Classification Search
    CPC ............. H10W 70/688; H10W 72/012; H10W 72/01204; H10W 72/01238; H10W 72/252
See application file for complete search history.

(56) References Cited

U.S. PATENT DOCUMENTS

2007/0036887 A1* 2/2007 Haase .................. H10K 71/166
    427/64
2007/0224722 A1* 9/2007 Matthews ........... H10W 72/012
    257/E31.124
2021/0296176 A1* 9/2021 Yeduru ................... H10P 54/00

* cited by examiner

*Primary Examiner* — Sitaramarao S Yechuri
(74) *Attorney, Agent, or Firm* — Heather Goo; Matthew F. Johnston; Trenton J. Roche

(57) ABSTRACT

A method is provided for fabricating indium bumps on a non-planar surface defined on a substrate having a base layer and a second layer disposed on a portion of the base layer. Photoresist material is layered on the surface of the substrate but is not in contact with edges of the second layer and regions of the base layer adjacent to the edges of the second layer. Portions of the photoresist material are removed to uncover corresponding portions of the base layer. A shadow mask is positioned on the photoresist material that is on the second layer such that the shadow mask extends over the regions of the base layer adjacent to the edges of the second layer. Indium is deposited on the corresponding portions of the base layer that are uncovered. The shadow mask and the photoresist material are then removed.

18 Claims, 2 Drawing Sheets

INDIUM BUMP FABRICATION ON NON-PLANAR SURFACE

ORIGIN OF THE INVENTION

Figure 1:
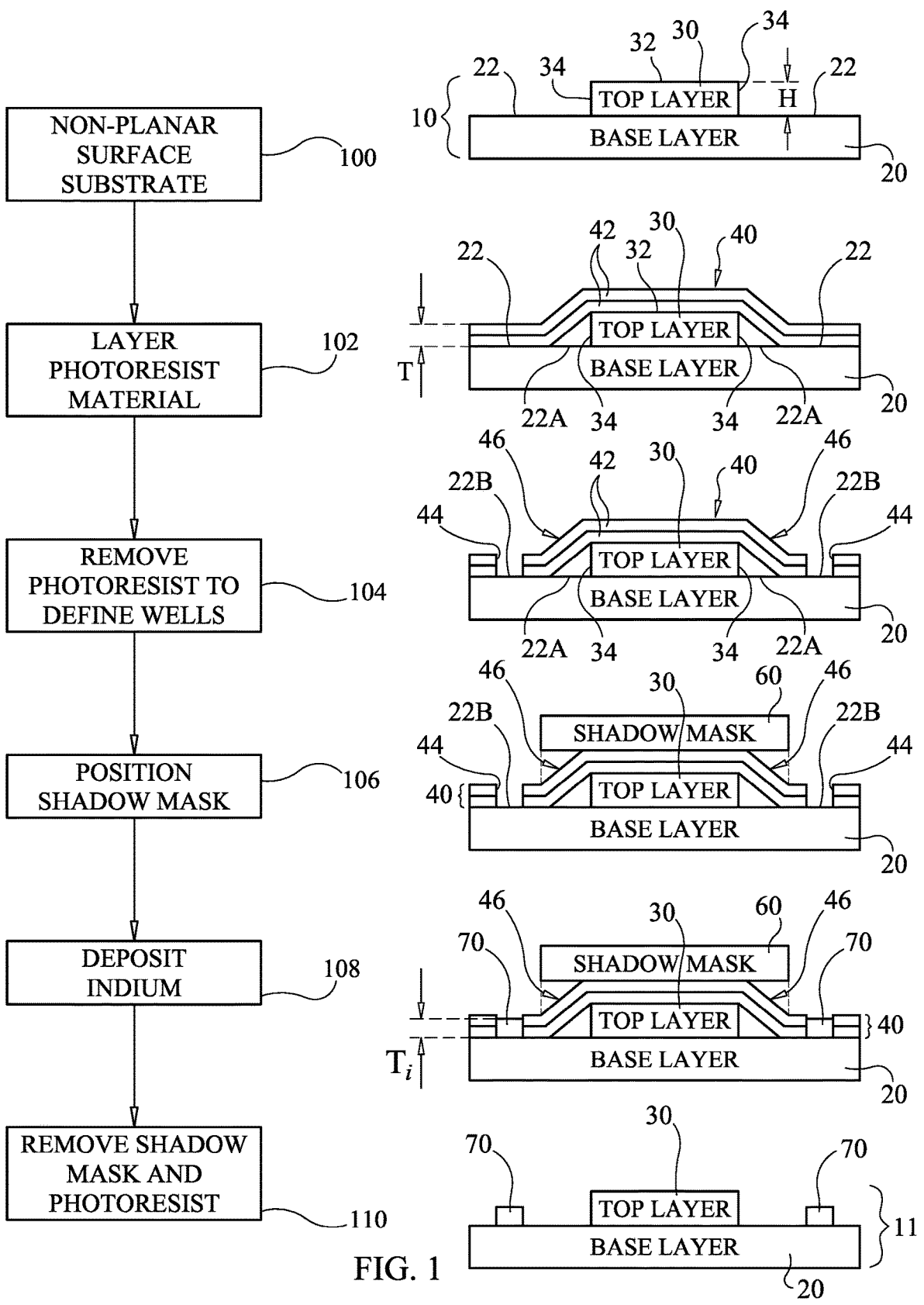

The invention described herein was made in part by an employee of the United States Government and may be manufactured and used by and for the Government of the United States for governmental purposes without the payment of any royalties thereon of therefor.

BACKGROUND OF THE INVENTION

1. Field of the Invention

The present disclosure relates to indium bump fabrication methods. More specifically, the present disclosure describes a method for fabricating indium bumps on planar portions of a non-planar surface that may result when the non-planar surface is defined by a flexible material disposed on a portion of a rigid material.

2. Description of the Related Art

Cryogenic detector assemblies require and include readout wiring and ancillary superconducting electronics. In some applications such as space-based applications, it is also desirable to make cryogenic detector assemblies as compact as possible to decrease the cooling power required to reach their operating temperature. Some cryogenic detector assemblies make use of flexible superconducting cables or "flex cables" to reduce the cryogenic detector assembly size since flex cables may be used to stack electronic circuit boards on top of each other. Flex cables must be connected electrically to components on the circuit boards via, for example, indium bumps deposited on the circuit boards. As is known in the art of cryogenic detector/circuit assemblies, the use of indium bumps is preferred as compared to conventional wire bond pads because the smaller (e.g., typically an order of magnitude smaller) indium bumps contribute to an overall reduction in size of the assembly. However, when a flex cable is provided on a circuit board prior to indium bump deposition, the combination of the flex cable and circuit board present an uneven or non-planar surface that does not lend itself to successful indium bump deposition using conventional processes.

SUMMARY OF THE INVENTION

Accordingly, it is an object of the present disclosure to provide methods and systems for fabricating indium bumps on portions of a non-planar surface.

Another object of the present disclosure is to provide methods and systems for fabricating indium bumps on a surface of a rigid material that has a flexible material disposed on the rigid material's surface.

Other objects and advantages of the present disclosure will become more obvious hereinafter in the specification and drawings.

In accordance with the present disclosure, a method is provided for fabricating indium bumps on a non-planar surface. The non-planar surface is defined on a substrate having a base layer and a second layer disposed on a portion of the base layer such that a surface of the substrate that includes the base layer and the second layer is non-planar. A photoresist material is layered on the surface of the substrate. The photoresist material is not in contact with edges of the second layer and regions of the base layer adjacent to the edges of the second layer. Portions of the photoresist material are removed to uncover corresponding portions of the base layer. A shadow mask is positioned on the photoresist material that is on the second layer such that the shadow mask extends over the regions of the base layer adjacent to the edges of the second layer. Indium is deposited on the corresponding portions of the base layer that are uncovered. The shadow mask and the photoresist material are then removed.

BRIEF DESCRIPTION OF THE DRAWING(S)

Figure 2:
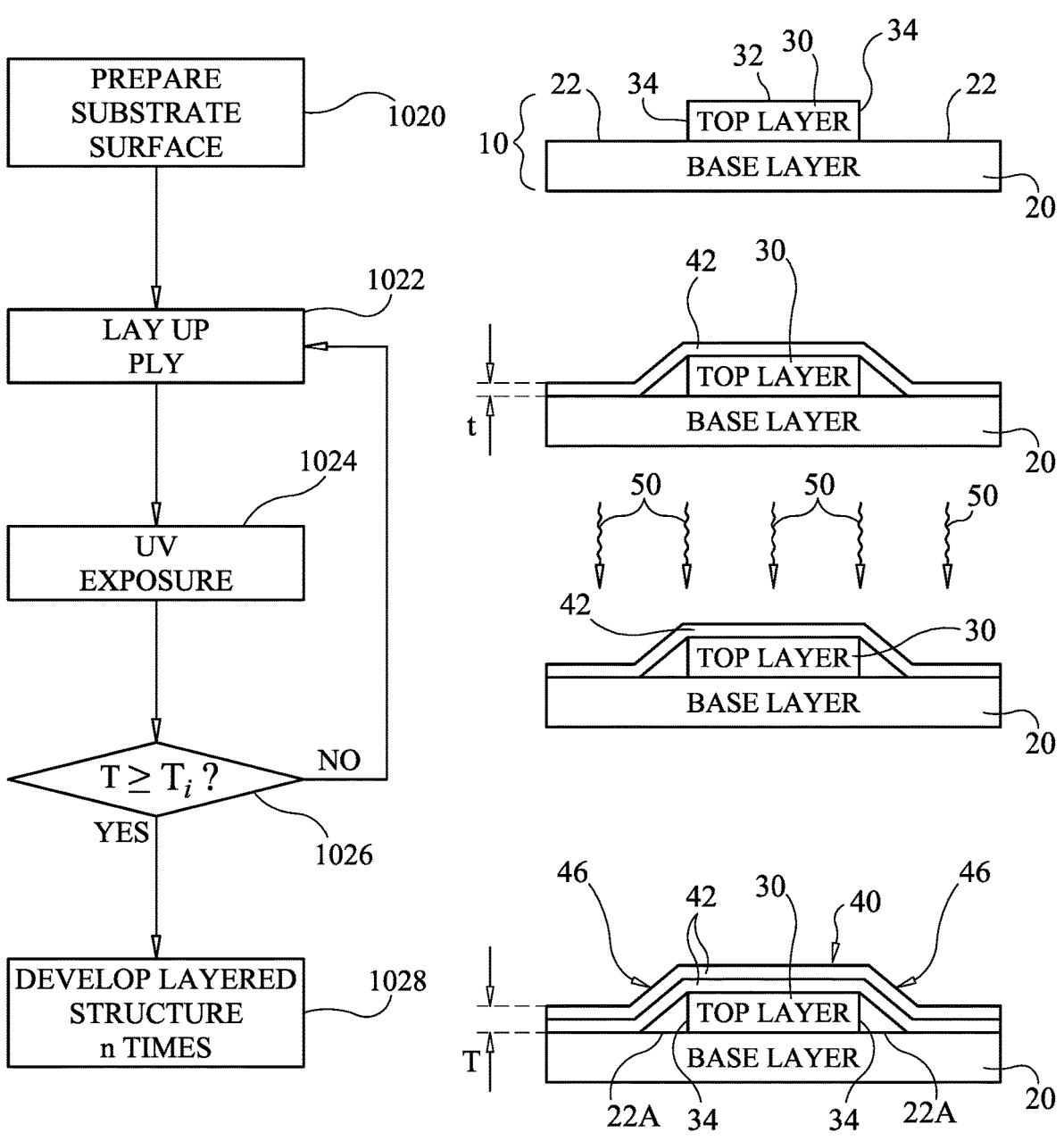

Other objects, features and advantages of the present invention will become apparent upon reference to the following description of the preferred embodiments and to the drawings, wherein corresponding reference characters indicate corresponding parts throughout the several views of the drawings and wherein:

FIG. 1 is a flow diagram and corresponding schematic illustrations of an embodiment of a method of fabricating indium bumps on a non-planar surface in accordance with various aspects as described herein; and FIG. 2 is a flow diagram and corresponding schematic illustrations of an embodiment of a method of layering photoresist material on a non-planar surface in accordance with various aspects as described herein.

DESCRIPTION OF THE PREFERRED EMBODIMENT(S)

The present disclosure describes methods and systems for fabricating indium bumps on, for example, a non-planar surface. Such non-planar surface topographies may be found in cryogenic detector assemblies in which flex cables are disposed on a surface of a rigid electronics circuit board. The fabrication of indium bumps to be described herein may also be used in the construction of a variety of quantum computer components whose operations are dependent upon miniaturization and cryogenic operating temperatures. By way of an illustrative example, the fabrication of indium bumps in accordance with the present disclosure will be described below for a non-planar surface defined by a rigid base layer (e.g., an electronics circuit board) having flexible top or second layer (e.g., a flex cable) disposed on a portion of the base layer.

Referring now to the drawings and more particularly to FIG. 1, a flow diagram is illustrated of an embodiment of a method of fabricating indium bumps on a non-planar surface in accordance with the present disclosure. Adjacent to the various blocks outlining the method steps are schematic illustrations of exemplary implementations of the method steps. It is to be understood that the elements and features in the schematic illustrations are sized for clarity and are not drawn to scale.

At block 100, a substrate 10 having a non-planar surface is provided. In general, substrate 10 has a base layer 20 and a top or second layer 30 disposed on a portion of base layer 20. In some embodiments, base layer 20 is a rigid material/structure such as a rigid electronics circuit board. A surface 22 of base layer 20 will ultimately have indium bumps (not shown in correspondence with block 100) deposited thereon as will be described further below. In some embodiments, top layer 30 is a flexible material/structure such as a flex cable that may be used to facilitate electrical connections to and/or between electrical components (not shown) installed on and/or integrated with base layer 20.

Top layer 30 is affixed to a portion of surface 22 of base layer 20 in accordance with techniques known in the art. The method for affixing top layer 30 to surface 22 is not part of or a limitation on the present disclosure. The exposed portions of top layer 30 are its top surface 32 and its peripheral edges 34. The thickness or height "H" of top layer 30 is generally 10 microns or greater. Thus, the inclusion of top layer 30 on a portion of surface 22 yields a non-planar surface of substrate 10 that is defined by exposed portions of surface 22 (i.e., not covered by top layer 30) and top surface 32 of top layer 30. In some embodiments, surfaces 22 and 32 are parallel to one another.

At block 102, a layered structure 40 of a photoresist material is disposed on the surface of substrate 10 defined by the above-described exposed portions of surface 22 and top surface 32. Each of the layers or plies 42 of layered structure 40 may be made from a polymer film that has been laid up on the substrate. In the illustrated example, two plies 42 are shown. However, it is to be understood that more than two plies 42 may be laid up to generate layered structure 40. Due to the height H of top layer 32, the lowermost ply 42 (and, therefore, the remaining plies 42) does not come into contact with peripheral edges 34 of top layer 30 as well as regions 22A of surface 22 that are immediately adjacent to peripheral edges 34.

Referring additionally now to FIG. 2, a flow diagram is illustrated of an embodiment of block 102's layering of the photoresist material on a non-planar surface in accordance with the present disclosure. Adjacent to the various blocks outlining the method steps are schematic illustrations of exemplary implementations of the method steps. Once again, the elements and features in the schematic illustrations are sized for clarity and are not drawn to scale.

At block 1020, the exposed portions of surface 22 and top surface 32 are prepared for the layering process. In some embodiments, block 1020's preparation of surfaces 22 and 32 may begin with their cleaning by, for example, an oxygen plasma cleaning process. In some embodiments, block 1020 may include the deposition of a sacrificial photoresist (not shown) by means of spin deposition followed by baking as is known in the art.

Following all preparation work at block 1020, a first of "n" plies 42 of a photoresist material is laid up on substrate 10 as indicated at block 1022. In some embodiments and as will be explained further below, each ply 42 may be a laminated photoresist material. The number of plies "n" is dependent on the thickness "t" of each ply 42 and the ultimate height or thickness "$T_i$" of the indium bumps that are to be fabricated as will be described further below. In general, the total thickness T (i.e., n×t) of layered structure 40 should be equal to or greater than the thickness $T_i$ of the indium bumps that are to be fabricated. After a ply 42 is laid up at block 1022, the ply 42 is exposed using ultraviolet (UV) radiation 50 as indicated at block 1024. Blocks 1022 and 1024 are repeated until the thickness T of the layered structure 40 is equal to or greater than the thickness $T_i$ of the indium bumps that are to be fabricated as indicated by decision block 1026.

As mentioned above, each ply 42 may be a laminated photoresist material. In terms of constructing layered structure 40 on a non-planar surface (e.g., defined by substrate 10 as described earlier herein), use of a laminated photoresist material provides good conformance to a non-planar surface and is readily layered to a desired thickness T in a controlled fashion thereby ultimately facilitating the deposition of consistent indium bumps. Commercially-available laminated photoresist materials include, for example, Riston FX-920 manufactured by DuPont de Nemours, Inc. or FR-4 manufactured by Current, Incorporated.

When decision block 1026 has been satisfied, the entirety of the layered structure 40 is developed n times as indicated at block 1028. More specifically, layered structure 40 may be developed using an established spray developer process, in which a chemical developer (e.g., MF319 manufactured by Rohm and Haas Electronic Materials LLC or AZ-400K manufactured by AZ Electronic Materials USA Corp) is applied to layered structure 40 in combination with de-ionized water.

Following the above-described layup and development process for the photoresist material, processing proceeds to block 104 (FIG. 1) where portions of the layered structure 40 are removed to define wells 44 in layered structure 40. Each well 44 extends to surface 22 of top layer 20 whereby that portion 22B of surface 22 defines the footprint of an indium bump to be deposited later in the process. Removal of the desired portions of layered structure 40 to create wells 44 may be achieved in a variety of ways. For example, spray developing of regions of laminated photoresist not exposed to UV radiation will remove the laminated resist portions of the layered structure 40. In embodiments where a sacrificial resist was applied (e.g., spun on) to substrate 10 prior to layering block 102, oxygen plasma ashing may be used to remove the sacrificial photoresist.

As described above, layered structure 40 does not come into contact with peripheral edges 34 of top layer 30 or regions 22A of surface 22 immediately adjacent to peripheral edges 34 after developing of the photoresist. That is, layered structure 40 has regions 46 that "tent over" the portions of substrate 10 defined by edges 34 and surface regions 22A. Since regions 46 are not oriented normal (or nearly normal) to the UV radiation 50 (FIG. 2) used to exposed each ply 42 of layered structure 40, tented regions 46 may not properly cure during UV exposure indicated at block 1024 as described above.

To protect regions 46 (and, therefore, the underlying peripheral edges 34 and surface regions 22A) during indium deposition, the method of the present disclosure positions a shadow mask 60 on layered structure 40 as indicated at block 106. More specifically, shadow mask 60 rests on or is affixed to layered structure 40 that is on top surface 32 of top layer 30. In addition, shadow mask 60 extends over regions 46, i.e., over peripheral edges 34 and surface regions 22A. In general, shadow mask 60 may be made from a material that does not abrade layered structure 40, will not outgas during indium deposition, and is thermally stable. Such materials include polyimides (e.g., KAPTON tape) and polyesters (e.g., MYLAR sheets).

With shadow mask 60 in position as described above, indium 70 is deposited into wells 44 as indicated at block 108. The thickness $T_i$ of the deposited indium 70 should not exceed the thickness T of layered structure 40. Methods for depositing indium 70 into wells 44 include thermal evaporation of indium in a suitable high vacuum or through use of an ultra-high vacuum deposition system.

Following deposition of indium 70 at block 108, the shadow mask 60 and layered photoresist structure 40 may be removed as indicated at block 110. For example, in embodiments where a sacrificial photoresist (not shown) is disposed between substrate 10 and layered structure 40, the entire assembly may be immersed in a solvent (e.g., acetone) to dissolve the sacrificial photoresist, and, consequently, cause the regions of the layered photoresist structure 40 to peel away or lift off. In embodiments where no sacrificial photoresist is used, block 108 may be achieved by . . . . Once the photoresist material(s) have been removed, the resulting structure 11 has indium bumps 70 on selected portions of surface 22 of base layer 20, e.g., an electronics circuit board.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A method, comprising:
providing a substrate having a base layer and a second layer disposed on a portion of the base layer, wherein a surface of the substrate that includes the base layer and the second layer is non-planar;
layering a photoresist material on the surface of the substrate, wherein the photoresist material is not in contact with edges of the second layer and regions of the base layer adjacent to the edges of the second layer;
removing portions of the photoresist material to uncover corresponding portions of the base layer;
positioning a shadow mask on the photoresist material that is on the second layer, wherein the shadow mask extends over the regions of the base layer adjacent to the edges of the second layer;
depositing indium on the corresponding portions of the base layer that are uncovered; and
removing the shadow mask and the photoresist material.

2. The method of claim 1, wherein the base layer comprises a rigid material and the second layer comprises a flexible material.

3. The method of claim 1, wherein the step of layering comprises a multi-step process to generate a thickness of the photoresist material that is equal to or greater than a thickness of the indium deposited on the corresponding portions of the base layer that are uncovered.

4. The method of claim 1, wherein the step of layering comprises:
laying up n plies of the photoresist material; and
developing, after the step of laying up, the n plies n separate times.

5. The method of claim 1, wherein the photoresist material on the base layer is parallel to the photoresist material on the second layer.

6. The method of claim 1, wherein the photoresist material comprises layers of a polymer film.

7. The method of claim 1, wherein the shadow mask is made from a material selected from the group consisting of polyimides and polyesters.

8. A method, comprising:
providing a substrate having a rigid layer and a flexible layer, the flexible layer being at least 10 microns thick and being disposed on a portion of the rigid layer;
layering a photoresist material on the rigid layer and the flexible layer, wherein the photoresist material has a thickness T, and wherein the photoresist material is not in contact with peripheral edges of the flexible layer and surface regions of the rigid layer adjacent to the peripheral edges of the flexible layer;

removing portions of the photoresist material to uncover corresponding portions of the rigid layer;
positioning a shadow mask on the photoresist material that is on the flexible layer, wherein the shadow mask extends over the surface regions of the rigid layer adjacent to the peripheral edges of the flexible layer;
depositing indium to a thickness $T_i$ on the corresponding portions of the rigid layer that are uncovered, wherein $T_i<T$; and
removing the shadow mask and the photoresist material.

9. The method of claim 8, wherein the rigid layer comprises an electronic circuit board and the flexible layer comprises a flex cable.

10. The method of claim 8, wherein the step of layering comprises:
laying up n plies of the photoresist material; and
developing, after the step of laying up, the n plies n separate times.

11. The method of claim 8, wherein the photoresist material on the rigid layer is parallel to the photoresist material on the flexible layer.

12. The method of claim 8, wherein the photoresist material comprises layers of a polymer film.

13. The method of claim 8, wherein the shadow mask is made from a material selected from the group consisting of polyimides and polyesters.

14. A method, comprising:
providing a substrate having a rigid material and a flexible material disposed on a surface portion of the rigid material, wherein a surface of the substrate that includes the rigid material and the flexible material is non-planar;
laying up n plies of a laminated photoresist material on the surface of the substrate, wherein the n plies are not in contact with peripheral edges of the flexible material and surface regions of the rigid material adjacent to the peripheral edges of the flexible material;
developing, after the step of laying up, the n plies n separate times;
removing regions of the n plies to uncover corresponding portions of the rigid material;
positioning a shadow mask over the n plies that are on the flexible material and over the surface regions of the rigid material adjacent to the peripheral edges of the flexible material;
depositing indium on the corresponding portions of the rigid material that are uncovered; and
removing the shadow mask and the photoresist material.

15. The method of claim 14, wherein the rigid material comprises an electronic circuit board and the flexible material comprises a flex cable.

16. The method of claim 14, wherein the n plies are greater in thickness than a thickness of the indium deposited on the corresponding portions of the rigid material that are uncovered.

17. The method of claim 14, wherein the n plies on the rigid material are parallel to the n plies on the flexible material.

18. The method of claim 14, wherein the shadow mask is made from a material selected from the group consisting of polyimides and polyesters.

* * * * *